United States Patent
Chen

(10) Patent No.: US 6,733,334 B2
(45) Date of Patent: May 11, 2004

(54) CONNECTOR STRUCTURE OF CIRCUIT BOARD FOR POWER SUPPLY APPARATUS

(75) Inventor: Chun-Chen Chen, Taoyuan Shien (TW)

(73) Assignee: Delta Electronics, Gueishan Shiang (TW)

( * ) Notice: Subject to any disclaimer, the term of this patent is extended or adjusted under 35 U.S.C. 154(b) by 0 days.

(21) Appl. No.: 10/440,728

(22) Filed: May 19, 2003

(65) Prior Publication Data

US 2003/0207613 A1 Nov. 6, 2003

Related U.S. Application Data

(63) Continuation-in-part of application No. 10/015,345, filed on Dec. 12, 2001, now abandoned.

(30) Foreign Application Priority Data

Jun. 19, 2001 (TW) ........................................ 90210312 U

(51) Int. Cl.$^7$ ............................................. H01R 13/73
(52) U.S. Cl. ........................................ 439/554; 439/567
(58) Field of Search .......................... 439/567, 79, 562, 439/565, 571, 554, 547

(56) References Cited

U.S. PATENT DOCUMENTS 6,123,580 A 9/2000 Bendorf et al. ............. 439/567
6,190,201 B1 2/2001 Shih et al. .................. 439/567

*Primary Examiner*—Tho D. Ta
(74) *Attorney, Agent, or Firm*—Pate Pierce & Baird

(57) ABSTRACT

A connector structure of a circuit board for a power supply apparatus includes an insulating housing, conductive terminals, and at least one supporting rods with each connected to the mounting surface of the insulating housing and having a pillared portion, a first protruding latch and a second protruding latch both extending laterally from a first location and a second location on the pillared portion of the supporting rod respectively. The thickness of a first circuit board is different from the thickness of a second circuit board, thus when a supporting rod passes through a first pinhole on the first circuit board, the first protruding latch props against a bottom of the first circuit board, and when a supporting rod passes through a second pinhole on the second circuit board, the second protruding latch props against a bottom of the second circuit board to prevent a movement of the connector respectively.

10 Claims, 9 Drawing Sheets

CONNECTOR STRUCTURE OF CIRCUIT BOARD FOR POWER SUPPLY APPARATUS

The present invention is a CIP application of the parent application "Connector Structure for Power Supply Apparatus" bearing on the Ser. No. 10/015,345 and filed on Dec. 12, 2001 now abandoned.

FIELD OF THE INVENTION

The present invention is directed to a connector structure for a power supply apparatus, and more particularly is directed to a connector structure of a circuit board for a power supply apparatus.

DESCRIPTION OF THE PRIOR ART

The power supply apparatus is mainly designed for rectifying and converting commercially available power into direct current (DC) power to power a power-receiving device. FIG. 1(a) and FIG. 1(b) respectively show an exploded view and an elevation view of a conventional power supply apparatus. The conventional power supply apparatus basically consists of an upper housing 1 and a lower housing 2. A space is defined between the upper housing 1 and the lower housing 2 for accommodating a circuit board 3 therein. A connector 4 and other necessary electronic elements 30 required by the power supply apparatus are mounted on the circuit board 3. A first concave 11 and a second concave (not shown) are respectively provided on the front side and the rear side of the upper housing 1. A third concave 21 and a fourth concave 22 respectively opposite to the first concave 11 and the second concave are respectively provided on the front side and the rear side of the lower housing 2. When the upper housing 1 and the lower housing 2 are jointed together, the first concave 11 and the third concave 21 forms a rabbet for infixing the connector 4 therein to receive external AC power. The circuitry mounted on the circuit board 3 rectify the AC power into DC power and supply the rectified DC power to power-receiving appliances such as printers, radios and modems through electric wires.

Referring to FIG. 2(a) to FIG. 2(d). The connector 4 basically includes an insulating housing 40 and two conductive terminals 42. The conductive terminals 42 are located in the through-holes inside the housing 40 and pass through the apertures on the backside of the housing (not shown) to create pins 41. Two supporting rods 43 are formed at the bottom 402 of the housing 40. Both the supporting rods 43 and the housing 40 are integrally formed by plastic injection molding technique. The two sides 431 of the supporting rod 43 respectively extends downwards from the bottom 402 of the housing 40 for a distance h and stretches out transversely to form a protruding member 433 with a protruding plane 432. The maximum transversal length d1 of the protruding member 433 is slightly larger than the width d2 of the pinhole 32, and the length h that the supporting rod 43 extends downwards from the housing bottom 402 is slightly larger than the thickness T of the circuit board 3. Because the supporting rod 43 is made up of a plasticity material with an inherent elasticity, the protruding member 433 can pass through the pinhole 32 of the circuit board 3 by exerting an external force thereto until the protruding plane props against the bottom of the circuit board 3. The connector 4 can be fixed to the circuit board 3 accordingly.

Referring back to FIG. 1(a), the connector 4 and the circuit board 3 are connected in such a way that the two metal pins 41 are inserted into the corresponding pinhole 31 on the circuit board 3. Subsequently the protruding member 433 of the supporting rod 43 passes through the pinhole 32 on the circuit board 3 and is adequately positioned. Finally the metal pins 41 are fixed to the circuit board 3 by welding technique.

However, though the above-described way for fixing the connector 4 to the circuit board 3 can allow the connector 4 to be mounted on the circuit board 3 steadily, taking a circuit board with a thickness of 1.6 millimeter and a circuit board with a thickness of 1.2 millimeter as examples, two types of connectors each of which is of different extension length h for the supporting rod are required to fulfill the demands of matching with the circuit boards of different thickness. That signifies that two different molds are needed to manufacture the connector. Therefore the manufacturing cost for the connector will increase substantially and the amount of connectors of different specifications is not likely to be determined in advance, which causes a difficulty in the material management operation.

Since a connector structure for holding circuit boards of different thickness is needed, an improved connector structure comprising an insulating housing, at least two conductive terminals, and at least one supporting rod was proposed in the previous application bearing on the Ser. No. 10/015, 345 and filed on Dec. 12, 2001. The proposed connector structure is characterized by that the two sides of the supporting rod respectively extends downwards for a first length and a second length and stretches out to form a protruding member with a first protruding plane and a second protruding plane, wherein the first length is slightly larger than a thickness of a first circuit board and the second length is slightly larger than a thickness of a second circuit board, such that when the protruding member passes through a first pinhole on the first circuit board, the first protruding plane props against a bottom of the first circuit board, and when the protruding member passes through a second pinhole on the second circuit board, the second protruding plane props against a bottom of the second circuit board. However, the important features that the first length is larger than the second length, the thickness of the first circuit board is larger than the second circuit board, the supporting rods are in pillared shape and without any slot or aperture, and the first protruding plane and the second protruding plane are substantially perpendicular to the supporting rods are not defined clearly in the claims but are illustrated in the drawings and described in the specification of the above-mentioned previous application. Therefore, the present invention with clearly defined claims regarding the above mentioned features is proposed as a CIP application to clarify all the ambiguities in the claims of the parent application.

In the invention of Bendorf et al. (U.S. Pat. No. 6,123, 580), a board lock disposed within the receiving aperture of an electrical connector for holding the connector on a thinner circuit board as well as on a thicker circuit board is proposed. The board lock includes a body having a connector engaging portion and two cantilever beams extending from opposite transverse edges. The inner edges of the beams define a slot in between that extends into an enlarged aperture in the center of the body. Each of the outer edges of the beams includes a protrusion and further includes a latching portion at the leading end. By locating the two latches at slightly different distances from the bottom of the housing of the connector the board lock can accommodate tolerance variations in the thickness of the board. Certain noticeable features of Bendorf et al. are that the two cantilever beams of the board lock are going through the same pinhole of the circuit board, only the portion of one latch that is beyond the width of its protrusion is engaged with the bottom surface of a circuit board, and the other latch is either remained in the pinhole for the thicker circuit board case or is spaced from the circuit board for the thinner circuit board case. But due to the following unique features of the present invention that the two supporting rods are in pillared shape without any slot or aperture employed and are aligned in parallel, each of the two supporting rods goes through a different pinholes respectively, the two first (second) protruding latches with one protruding latch from each supporting rod are both propped against the bottom surface of the circuit board and are substantially perpendicular to the supporting rods, and one first (second) protruding latch is stretched to the right and the other first (second) protruding latch is stretched to the left respectively, the connector could be hold to the circuit board more firmly than in the case of Bendorf et al. where only one out of the two latches is engaged with the bottom surface of the circuit board.

In Bendorf et al., if the circuit board is flexed downward a sufficient amount, the two cantilever beams will be pushed inwardly against the slot to become more closely. The two cantilever beams are integrally formed with the housing of the board lock which is disposed within the receiving aperture of the connector. If there is a space squashed out of the slot in between the two cantilever beams, then that will result a upward movement of the connector. One of the two cantilever beams is only having either a protrusion or a latch extended outwardly against the wall of the pinhole but not engaged with the bottom surface of the circuit board. The flexed circuit board will lean to the cantilever beam with the latch either in or away from the pinhole, and the connector will be moved upwardly a little bit while the cantilever beam with the latch either in or away from the pinhole is slid upwardly along the wall of the pinhole since only the other latch is engaged with the bottom surface of the circuit board. Therefore, a space squashed out of the slot in between the two cantilever beams will cause the board lock to slide upwardly along the pinhole and lean to the outer edge of one cantilever beam with a maximum distance counting from the protrusion to the latch of the same cantilever beam if the protrusion is extended outwardly against the wall of the pinhole, and with a maximum distance up to the space squashed out of the slot if the latch is extended outwardly against the wall of the pinhole. Due to the unique features of the present invention mentioned above, the two supporting rods will be firmly positioned and connected to the connector by the two first (second) protruding latches which are firmly engaged with the bottom surface of the connector and there is no possibility that the connector could be moved upwardly. Therefore, there is no such a problem in the present invention that the connector might be moved upwardly by flexed a sufficient amount of the circuit board.

In Bendorf et al., the two cantilever beams are integrally formed with the housing of the board lock which is disposed within the receiving aperture of the connector. Thus, the board lock and the connector might be separated if an unexpected force is employed to pull the connector outwardly by accident before the welding process. But in the present invention, the two supporting rods are integrally formed with the insulating house of the connector and there is no separable component like the block lock of the Bendorf et al. in the connector. Therefore, there is no such a problem in the present invention that a component might be pulled out of the connector by accident.

A board lock with a high retention force typically requires a high insertion force, which makes it harder to mount the connector to the board. In Bendorf et al., it is proclaimed that less insertion force is required when the connector is mounted to the circuit board due to an enlarged aperture in the board lock is employed causing the lengths of the cantilever beams to be extended, and the supporting rods to be more flexible than those of the prior arts. But the slot and aperture in between the two cantilever beams are still employed to applied a retention force to the wall of a pinhole on the circuit board in Bendorf et al., the dilemma of high retention force versus high insertion force still remains. Due to the following reasons regarding the present invention that the supporting rods are in pillared shape and there is no slot or aperture employed, the maximum transversal length of each protruding latch is just slightly larger than the width of each pinhole, and the elasticity of the protruding latchs made of plastic material, the insertion force needed to push each of the supporting rod through each of the pinhole is much less than the insertion force needed in Bendorf et al. where a slot and an aperture in between the two cantilever beams are employed to produce the retention force.

Therefore, the purpose of the present invention is to develop a connector structure of a circuit board for a power supply apparatus to deal with the above situations encountered in the prior arts.

SUMMARY OF THE INVENTION

An object of the present invention is the provision of a connector structure for a power supply apparatus which can be applied for circuit boards of different thickness and can be fixed to the circuit board steadily.

Another object of the present invention is the provision of a connector structure for a power supply apparatus for reducing the manufacturing cost of the connector.

A first aspect of the present invention is a presentation of a connector for a power supply apparatus, including: an insulating housing having a mounting surface; at least two conductive terminals; and a supporting rod connected to the mounting surface of the insulating housing, further including: a pillared portion; a first protruding latch connected to the pillared portion and extending laterally from a first location on the pillared portion; and a second protruding latch connected to the pillared portion and extending laterally from a second location on the pillared portion, wherein, a thickness of first circuit board is different from a thickness of the second circuit board, the first location is one of those closer to and further away from the mounting surface than the second location and the first protruding latch and the second protruding latch are vertically displaced, such that when the supporting rod passes through a first pinhole on the first circuit board, the first protruding latch props against the bottom of the first circuit board, and when the supporting rod passes through a second pinhole on the second circuit board, the second protruding latch props against the bottom of the second circuit board to prevent a movement of the connector respectively.

In accordance with the connector as described hereinto, the supporting rod is integrally formed with the mounting surface of the insulating housing.

In accordance with the connector as described hereinto, the first protruding latch is integrally formed with the pillared portion of the supporting rod.

In accordance with the connector as described hereinto, the second protruding latch is integrally formed with the pillared portion of the supporting rod.

In accordance with the connector as described hereinto, wherein the projection of the protruding direction of the first protruding latch of the supporting rod and the projection of the protruding direction of the second protruding latch of the supporting rod have an angle of 180 degrees.

A second aspect of the present invention is a presentation of a connector for a power supply apparatus, including: an insulating housing having a mounting surface; at least two conductive terminals; and two supporting rods having a first supporting rod and a second supporting rod both connected to the mounting surface of the insulating housing and aligned in parallel, each further including: a pillared portion; a first protruding latch connected to the pillared portion and extending laterally from a first location on the pillared portion; and a second protruding latch connected to the pillared portion and extending laterally from a second location on the pillared portion, wherein, a thickness of first circuit board is different from a thickness of the second circuit board, the first location is one of those closer to and further away from the mounting surface than the second location, the first protruding latch and the second protruding latch of one of the first supporting rod and the second supporting rod are vertically displaced respectively, and the first protruding latches of the first supporting rod and the second supporting rod, and the second protruding latches of the first supporting rod and the second supporting rod are horizontally linearly displaced respectively, such that when the first supporting rod passes through a first pinhole on the first circuit board and the second supporting rod passes through a second pinhole on the first circuit board, the first protruding latches of the first and second supporting rods prop against the bottom of the first circuit board, and when the first supporting rod passes through a first pinhole on the second circuit board and the second supporting rod passes through a second pinhole on the second circuit board, the second protruding latches of the first and second supporting rods prop against the bottom of the second circuit board to prevent a movement of the connector respectively.

In accordance with the connector as described hereinto, the supporting rod is integrally formed with the mounting surface of the insulating housing.

In accordance with the connector as described hereinto, each of the first protruding latches is integrally formed with each of the pillared portions of the supporting rods.

In accordance with the connector as described hereinto, each of the second protruding latches is integrally formed with each of the pillared portions of the supporting rods.

In accordance with the connector as described hereinto, the projection of the protruding direction of the first protruding latch of the first supporting rod and the projection of the protruding direction of the first protruding latch of the second supporting rod have a angle of 180 degrees, and the projection of the protruding direction of the second protruding latch of the first supporting rod and the projection of the protruding direction of the second protruding latch of the second supporting rod have the angle of 180 degrees.

Now the foregoing and other features and advantages of the present invention will be more clearly understood through the following descriptions with reference to the accompanying drawings, in which:

DETAILED DESCRIPTION OF THE PREFERRED EMBODIMENT

An exemplary embodiment of the present invention now will be fully described with reference to the following preferred embodiment. It is to be emphasized that the following descriptions of embodiments and examples of the present invention is only illustrative, and it is not intended to be exhaustive or not to be limited to the precise form disclosed.

Figure 1A:
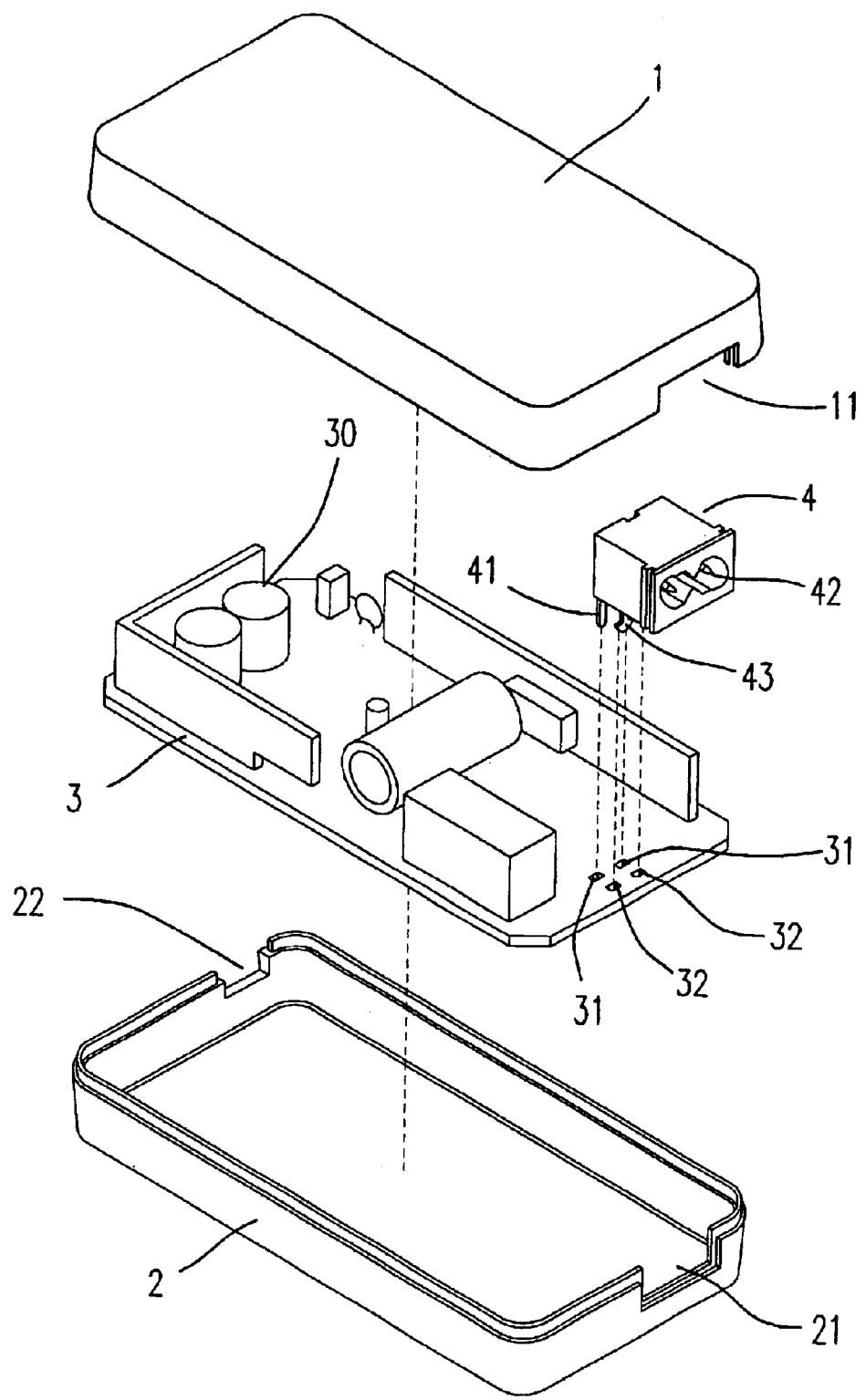
FIG. 1(a) is an exploded view showing a conventional power supply apparatus.
Figure 1B:
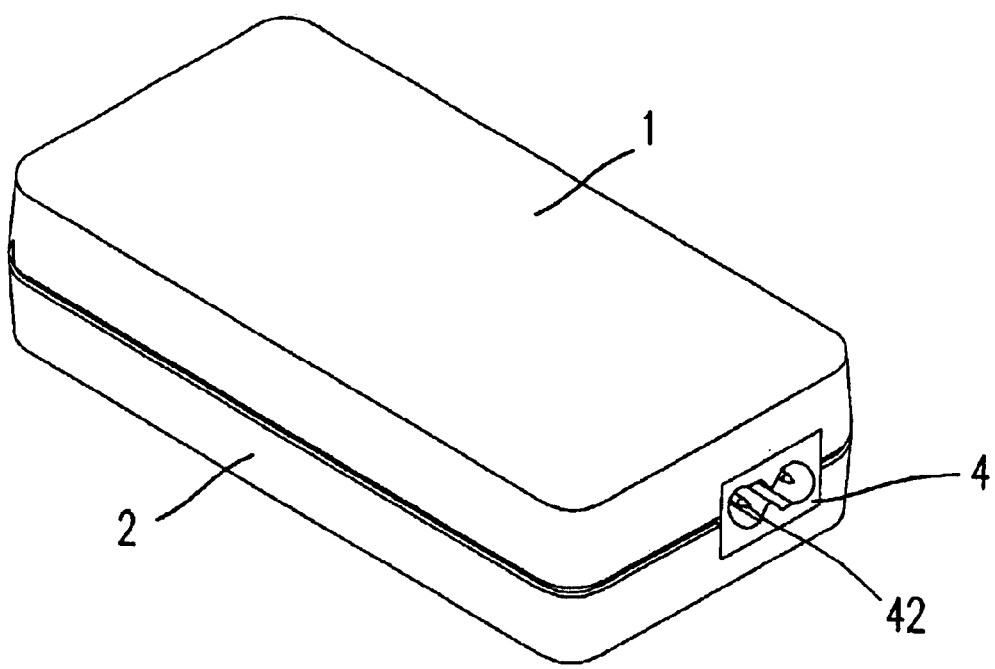
FIG. 1(b) is an elevation view showing a conventional power supply apparatus.
Figure 2A:
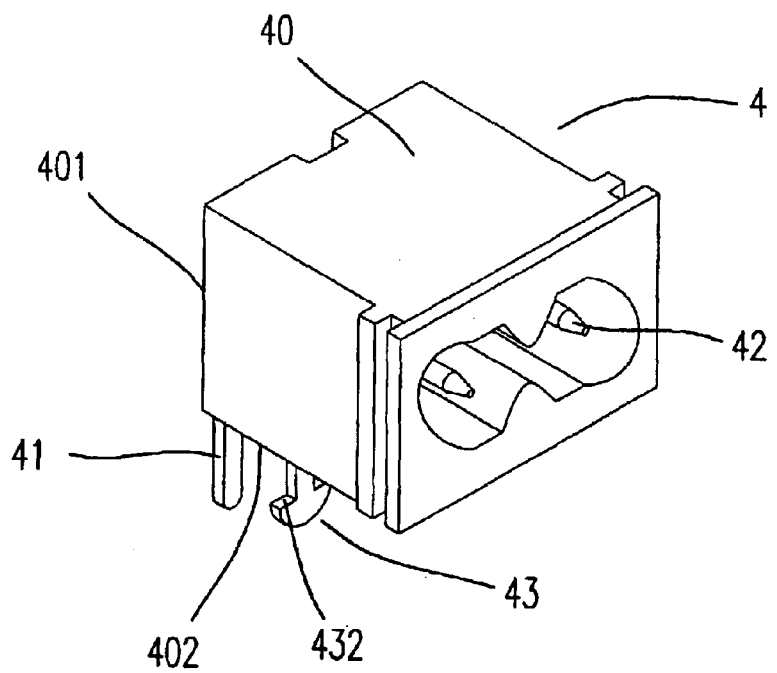
FIG. 2(a) is a perspective view of a connector for a power supply apparatus of the prior art.
Figure 2B:
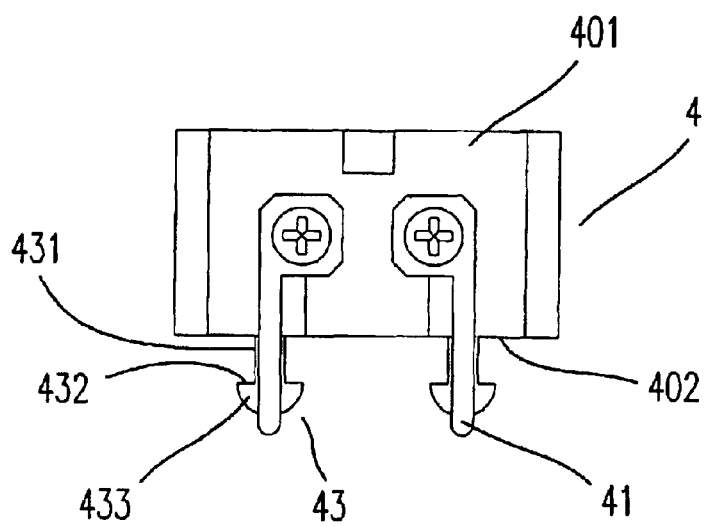
FIG. 2(b) is a backside view of a connector for a power supply apparatus of the prior art.
Figure 2C:
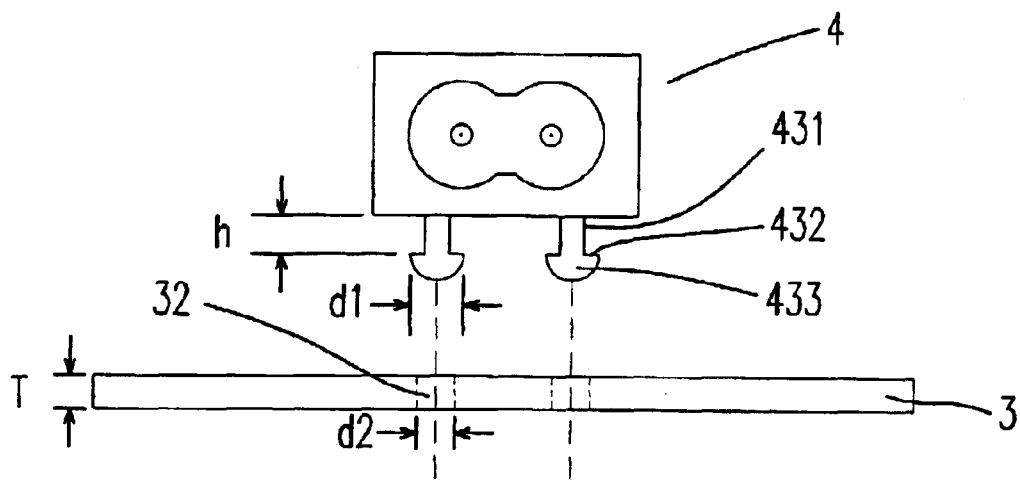
FIG. 2(c) is a schematic chart illustrating how the supporting rod of the connector is inserted into the pinhole on the circuit board according to the prior art.
Figure 2D:
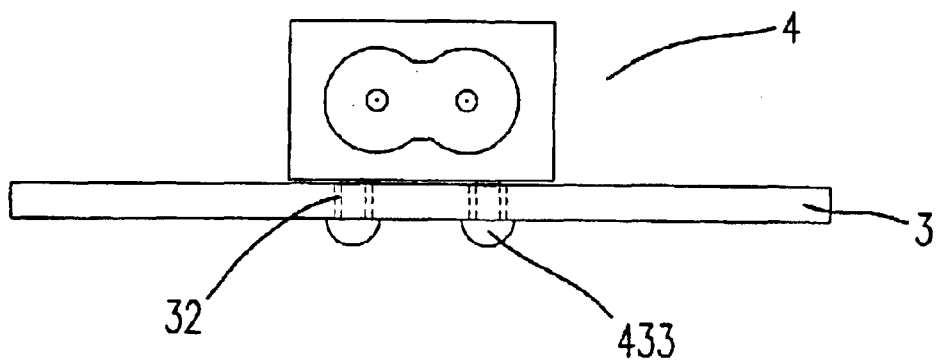
FIG. 2(d) is a schematic chart illustrating how the supporting rod of the connector is positioned onto the circuit board according to the prior art.
Figure 3A:
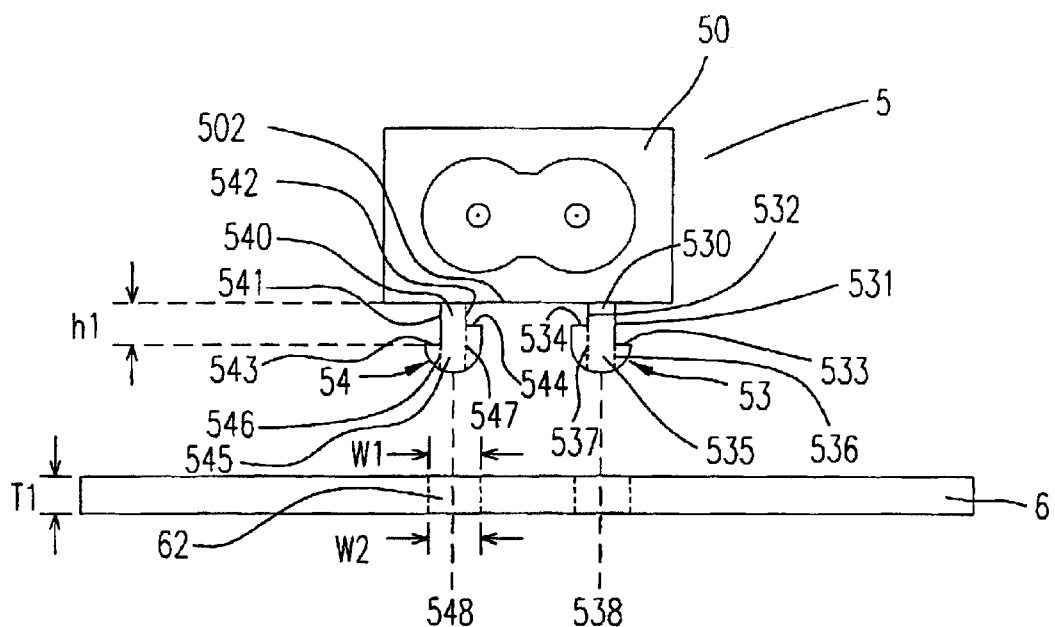
FIG. 3(a) is a schematic diagram illustrating how the supporting rod of the connector is inserted into a pinhole on a first circuit board of a thickness $T_1$ according to the present invention.
Figure 3B:
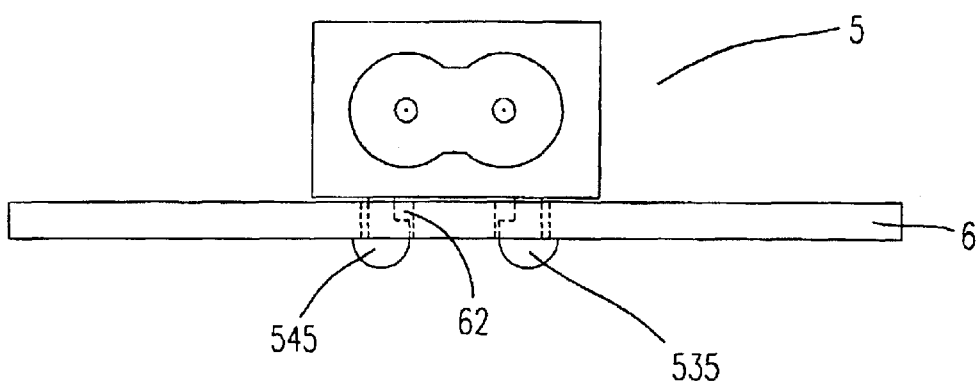
FIG. 3(b) is a schematic diagram illustrating how the supporting rod of the connector is positioned onto a first circuit board of a thickness $T_1$ according to the present invention.
Figure 3C:
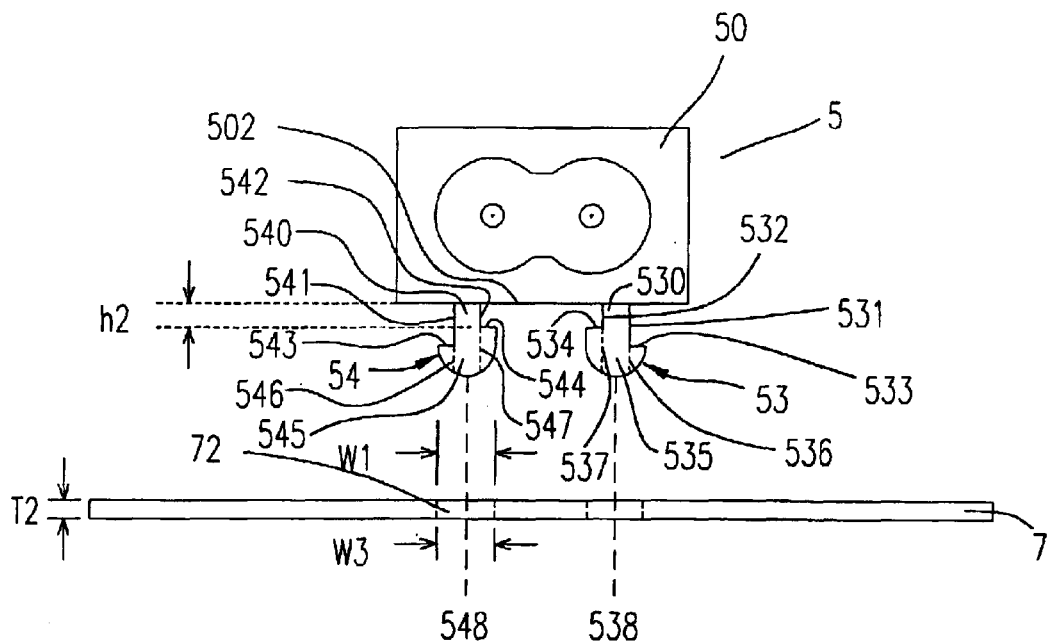
FIG. 3(c) is a schematic diagram illustrating how the supporting rod of the connector is inserted into a pinhole on a second circuit board of a thickness $T_2$ according to the present invention.
Figure 3D:
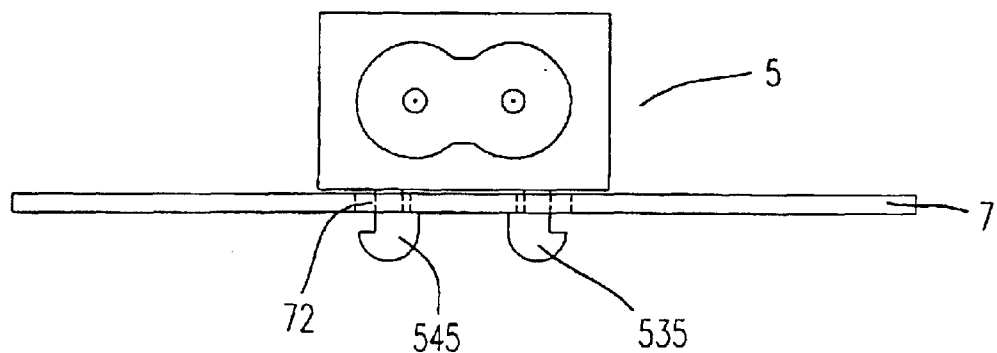
FIG. 3(d) is a schematic diagram illustrating how the supporting rod of the connector is positioned onto a second circuit board of a thickness $T_2$ according to the present invention.

FIG. 3(a) and FIG. 3(b) are schematic diagrams respectively illustrating how the supporting rod of the connector is inserted into a pinhole on a first circuit board 6 of a thickness $T_1$ according to the present invention and how the supporting rod of the connector is positioned onto the first circuit board 6 of a thickness $T_1$ according to the present invention. FIG. 3(c) and FIG. 3(d) are schematic diagrams respectively illustrating how the supporting rod of the connector is inserted into a pinhole on a second circuit board 7 of a thickness $T_2$ according to the present invention and how the supporting rod of the connector is positioned onto the second circuit board 7 of a thickness $T_2$ according to the present invention. A first supporting rod 53 and a second supporting rod 54 are formed at the mounting surface 502 of the housing 50 of the connector 5. The first supporting rod 53 and the second supporting rod 54 are integrally formed with the housing 5 with plastic injection molding technique. A pillared portion 530 of the first supporting rod 53 having two sides 531 and 532 respectively extends downwards for a first length $h_1$ and a second length $h_2$, and then stretches out to form a protruding member 535 with a first protruding latch 533 and a second protruding latch 534 both extending laterally from a first location 536 and a second location 537 on the first supporting rod 53. By the same token, a pillared portion 540 of the second supporting rod 54 having two sides 541 and 542 respectively extends downwards for a first length $h_1$ and a second length $h_2$, and then stretches out to form a protruding member 545 with a first protruding latch 543 and a second protruding latch 544 both extending laterally from a first location 546 and a second location 547 on the second supporting rod 54.

Figure 4A:
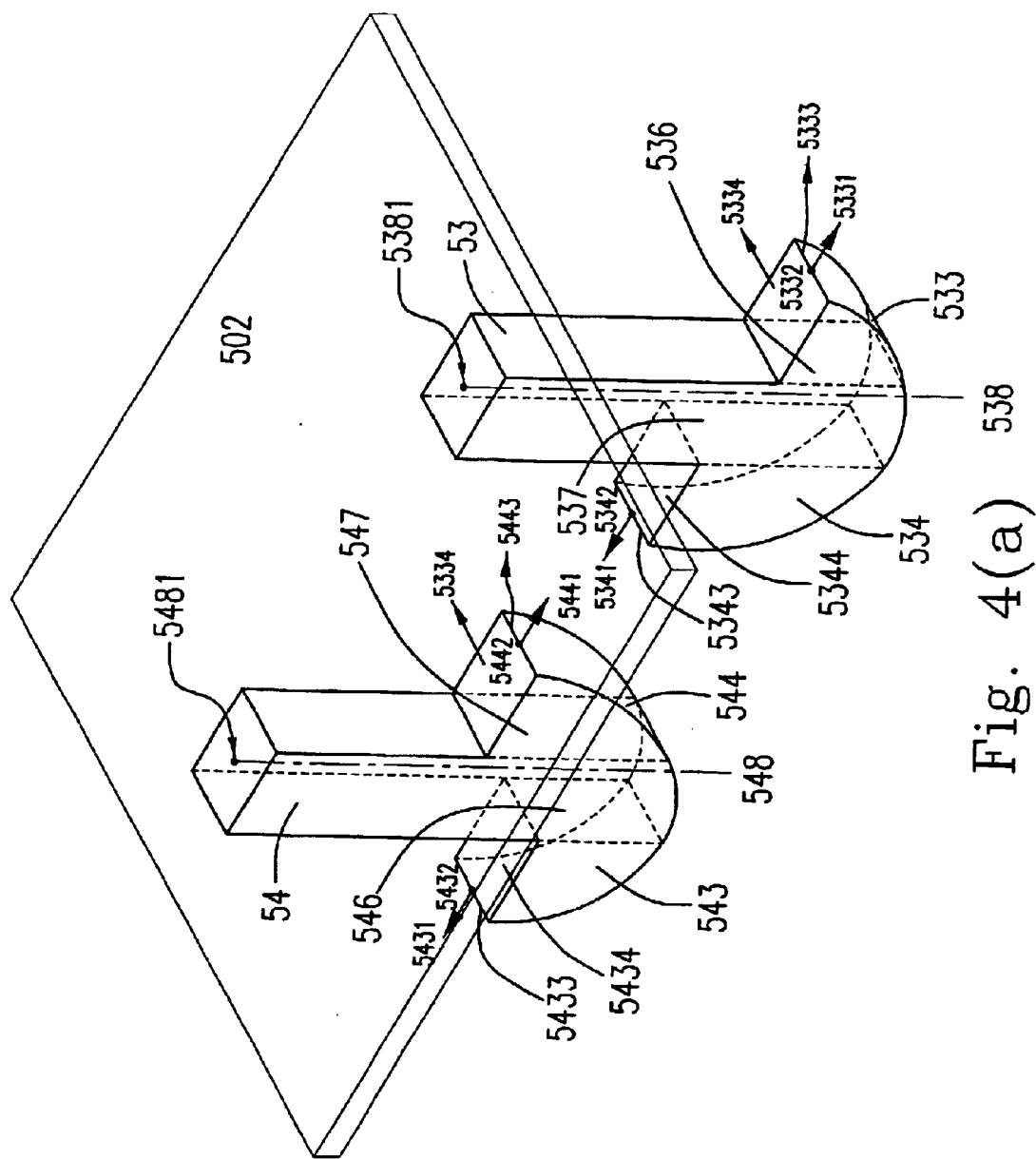
FIG. 4(a) is a schematic diagram showing the protruding directions of the first and second protruding latches of the first and second supporting rods respectively.
Figure 4B:
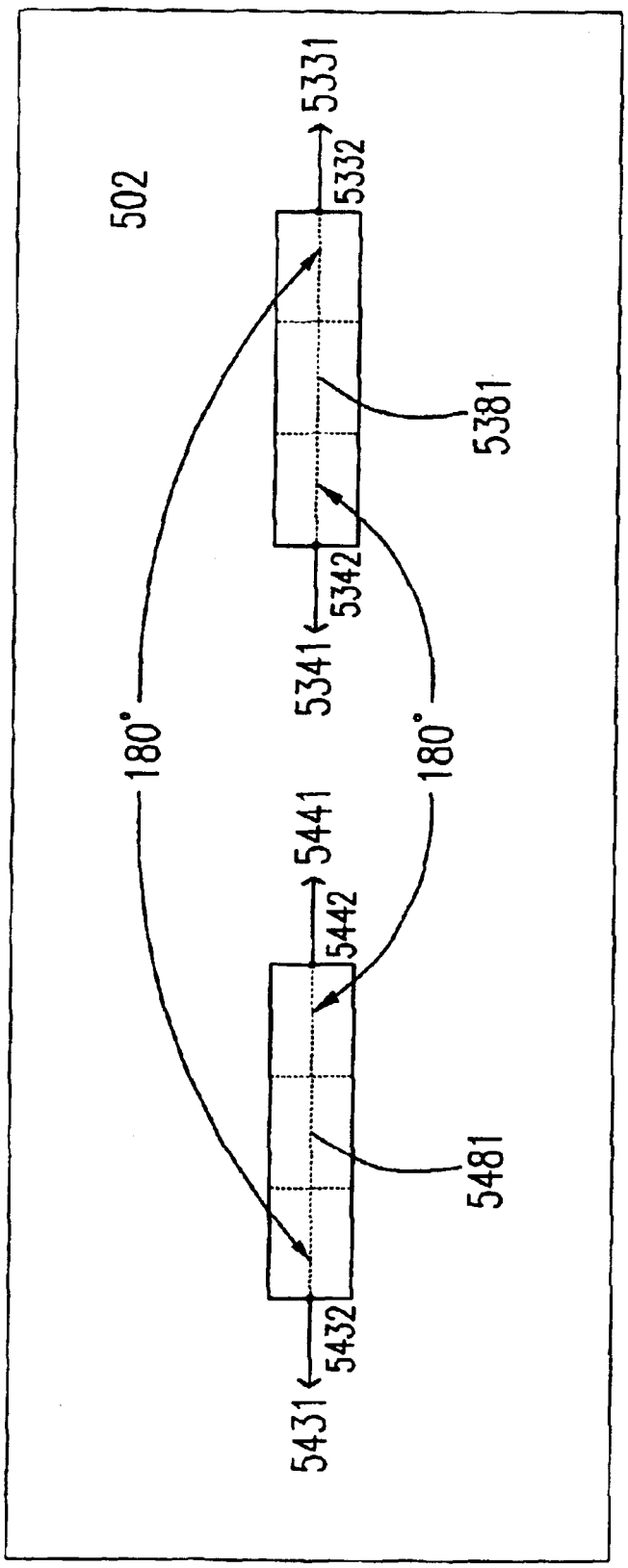
FIG. 4(b) is a schematic diagram showing a case with the two angles between the projections of the protruding directions of the first protruding latches of the first and second supporting rods and between the projections of the second protruding latches of the first and second supporting rods respectively upon the mounting surface both being 180 degrees.
Figure 4C:
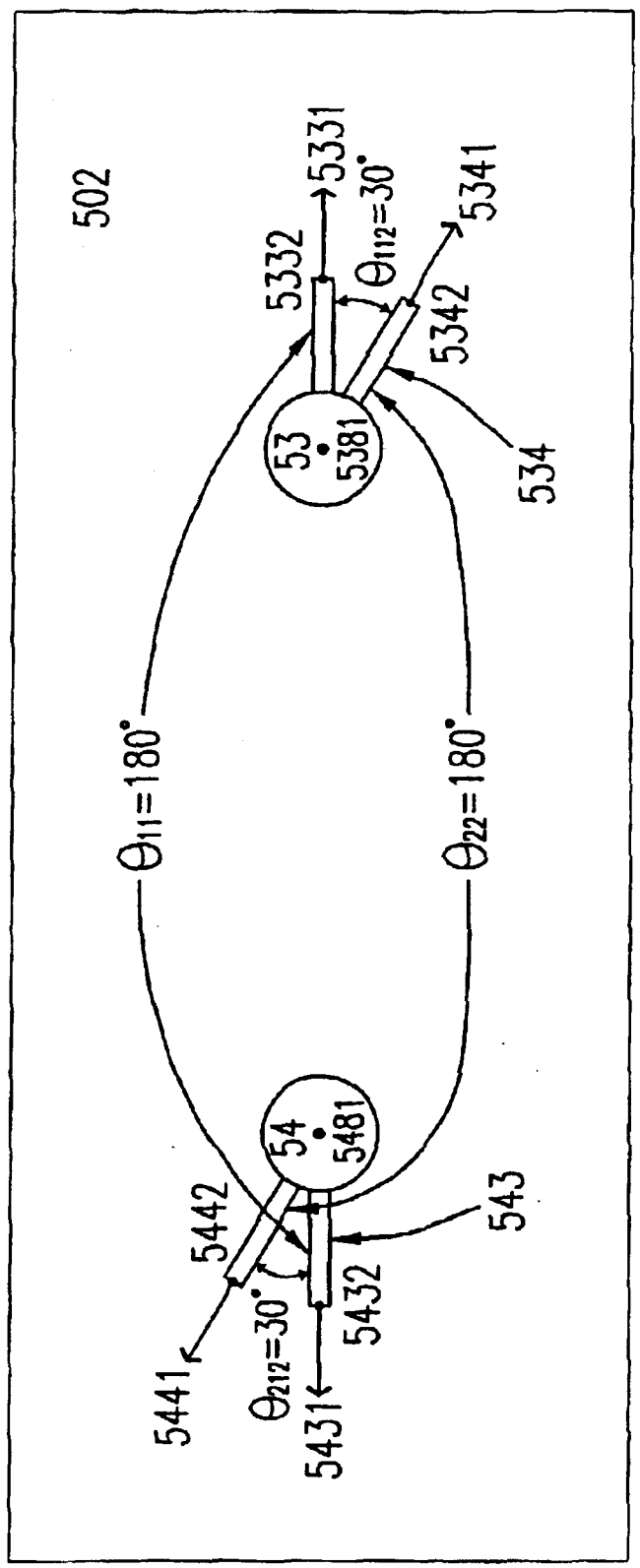
FIG. 4(c) is a schematic diagram showing a case with the four angles between the projections of the protruding directions of the first protruding latch and second protruding latch of one of the first and second supporting rods and one of first and second protruding latches of the first supporting rod and second supporting rod respectively upon the mounting surface.

Please refer to FIG. 4(*a*), the first supporting rod 53 and the second supporting rod 54 are aligned in parallel, the first protruding latch 533 of the first supporting rod 53 and the first protruding latch 543 of the second supporting rod 54 are stretched in opposite directions, and the second protruding latch 534 of the first supporting rod 53 and the second protruding latch 544 of the second supporting rod 54 are stretched in opposite directions respectively. Which means the angle between the projection of a protruding direction 5331 of the first protruding latch 533 and the projection of a protruding direction 5431 of the second protruding latch 543 is 180 degrees, and the angle between the projection of a protruding direction 5341 of the first protruding latch 534 and the projection of a protruding direction 5441 of the second protruding latch 544 is 180 degrees too. The protruding direction 5331 is a central normal pointing outwardly away from the central axis 538 and passing through a central position 5332 of the outer edge 5333, and is horizontally aligned with the surface of the protruding plane 5334 of the first supporting rod 53. The protruding direction 5341 is a central normal pointing outwardly away from the central axis 538 and passing through a central position 5342 of the outer edge 5343, and is horizontally aligned with the surface of the protruding plane 5344 of the first supporting rod 53. The protruding direction 5431 is a central normal pointing outwardly away from the central axis 539 and passing through a central position 5432 of the outer edge 5433, and is horizontally aligned with the surface of the protruding plane 5434 of the second supporting rod 54. The protruding direction 5441 is a central normal pointing outwardly away from the central axis 539 and passing through a central position 5442 of the outer edge 5443, and is horizontally aligned with the surface of the protruding plane 5444 of the second supporting rod 54. Please refer to FIG. 4(*b*), the projection of a protruding direction 5331 passing through a central position 5332 using the mounting surface 502 as the projecting surface is pointing outwardly away from a point 5381 located both on the mounting surface 502 and on the central axes 538 as a reference origin, and the projection of a protruding direction 5431 passing through a central position 5432 using the mounting surface 502 as the projecting surface is pointing outwardly away from a point 5481 located both on the mounting surface 502 and on the central axes 548 as a reference origin. The angle between the projection of the protruding direction 5331 and the projection of the protruding direction 5431 is 180 degrees. The projection of a protruding direction 5341 passing through a central position 5342 using the mounting surface 502 as the projecting surface is pointing outwardly away from a point 5381 located both on the mounting surface 502 and on the central axes 538 as a reference origin, and the projection of a protruding direction 5441 passing through a central position 5442 using the mounting surface 502 as the projecting surface is pointing outwardly away from a point 5481 located both on the mounting surface 502 and on the central axes 548 as a reference origin. The angle between the projection of the protruding direction 5341 and the projection of the protruding direction 5441 is 180 degrees too.

Please refer to FIG. 4(*c*), a second preferred embodiment of the present invention could have a cylindrical shaped first supporting rod 53 having a first latch 533 and a second latch 534 with a angle θ112 (30 degrees) between the projections of the protruding directions 5331 and 5341 onto the mounting surface 502 using the point 5381 as the reference origin, and a cylindrical shaped second supporting rod 54 having a first latch 543 and a second latch 544 with a angle θ212 (30 degrees) between the projections of the protruding directions 5431 and 5441 onto the mounting surface 502 using the point 5381 as the reference origin. By the same token, a angle θ11 between the projections of the protruding directions 5331 and 5431 onto the mounting surface 502 using the points 5381 and 5481 as the reference origins respectively is 180 degrees. A angle θ22 between the projections of the protruding directions 5341 and 5441 onto the mounting surface 502 using the points 5381 and 5481 as the reference origins respectively is 180 degrees too. The angles θ112, θ212, θ11, and θ22 each could have an included angle except being 0 respectively so as to fix the connector 50 to the circuit board properly and to prevent a movement of the connector 50 from the circuit board.

Please refer to FIG. 3(*a*) and FIG. 4(*a*) again. The first protruding latch 533 and the second protruding latch 534 of the first supporting rod 53, the first protruding latch 543 and the second protruding latch 544 of the second supporting rod 54 are vertically displaced respectively. Which means the first protruding latch 533 and the second protruding latch 534 of the first supporting rod 53, the first protruding latch 543 and the second protruding latch 544 of the second supporting rod 54 are not vertically aligned respectively. The first protruding latches (533 and 543) of the first supporting rod 53 and the second supporting rod 54, and the second protruding latches (534 and 544) of the first supporting rod 53 and the second supporting rod 54 are horizontally linearly displaced respectively. Which means the first protruding latches (533 and 543) of the first supporting rod 53 and the second supporting rod 54, and the second protruding latches (534 and 544) of the first supporting rod 53 and the second supporting rod 54 are not horizontally linearly aligned respectively.

In the present embodiment, the first length $h_1$ is slightly larger than the thickness $T_1$ of the first circuit board 6, the second length $h_2$ is slightly larger than the thickness $T_2$ of the second circuit board 7, and the first length $h_1$ is larger than the second length $h_2$. More preferably, the thickness $T_1$ of the first circuit board 6 is 1.6 millimeter, and the thickness $T_2$ of the second circuit board 7 is 1.2 millimeter.

Certainly, the position and dimension of the pinhole 62 on the first circuit board 6 and the pinhole 72 on the second circuit board 7 has to be dynamically modulated. The maximum transversal length $W_1$ of the protruding member 535 is slightly larger than the width $W_2$ of the pinhole 62 on the first circuit board 6 and the width $W_3$ of the pinhole 72 on the second circuit board 7. In FIG. 3(*a*) and FIG. 3(*b*), by exerting an external force thereto the protruding member 535 can pass through the pinhole 62 on the first circuit board 6 due to its elasticity, such that the first protruding latch 533 can prop against the bottom of the first circuit board 6 and the connector 5 can be fixed to the first circuit board 6. By the same token, in FIG. 3(*c*) and FIG. 3(*d*), by exerting an external force thereto the protruding member 535 can pass through the pinhole 72 on the second circuit board 7 due to its elasticity, such that the second protruding latch 534 can prop against the bottom of the second circuit board 7 and the connector 5 can be fixed to the second circuit board 7.

Certainly, the supporting rod of the connector of the present invention can not only fit for the connector with two conductive terminals, but also fit for the connector with three conductive terminals (with a conductive terminal is designated as a ground terminal).

Of course, the amount of the supporting rod of the connector according to the present invention can be one or more than two, wherein two is the most preferable.

In conclusion, the connector of the present invention adopts a particular supporting rod arrangement, and thereby the connector of the present invention can be positioned and fixed onto the circuit boards of different thickness. As a result, only a connector is required for two circuit boards each of which is of a different thickness. By way of standardizing the supporting rod arrangement, the objectives of reducing manufacturing cost of the connector and improving the efficiency of material management operation can be achieved with ease.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A connector for a power supply apparatus, comprising:
    an insulating housing having a mounting surface;
    at least two conductive terminals; and
    a supporting rod connected to said mounting surface of said insulating housing, further comprising:
        a pillared portion;
        a first protruding latch connected to said pillared portion and extending laterally from a first location on said pillared portion; and
        a second protruding latch connected to said pillared portion and extending laterally from a second location on said pillared portion,
        wherein, a thickness of first circuit board is different from a thickness of said second circuit board, said first location is one of those closer to and further away from said mounting surface than said second location, and said first protruding latch and said second protruding latch are vertically displaced, such that when said supporting rod passes through a first pinhole on said first circuit board, said first protruding latch props against said bottom of said first circuit board, and when said supporting rod passes through a second pinhole on said second circuit board, said second protruding latch props against said bottom of said second circuit board to prevent a movement of said connector respectively.

2. The connector according to claim 1, wherein said supporting rod is integrally formed with said mounting surface of said insulating housing.

3. The connector according to claim 1, wherein said first protruding latch is integrally formed with said pillared portion of said supporting rod.

4. The connector according to claim 1, wherein said second protruding latch is integrally formed with said pillared portion of said supporting rod.

5. The connector according to claim 1, wherein a projection of a protruding direction of said first protruding latch of said supporting rod and said projection of said protruding direction of said second protruding latch of said supporting rod have an angle of 180 degrees.

6. A connector for a power supply apparatus, comprising:
    an insulating housing having a mounting surface;
    at least two conductive terminals; and
    two supporting rods having a first supporting rod and a second supporting rod both connected to said mounting surface of said insulating housing and aligned in parallel, each further comprising:
        a pillared portion;
        a first protruding latch connected to said pillared portion and extending laterally from a first location on said pillared portion; and
        a second protruding latch connected to said pillared portion and extending laterally from a second location on said pillared portion,
        wherein, a thickness of first circuit board is different from a thickness of said second circuit board, said first location is one of those closer to and further away from said mounting surface than said second location, said first protruding latch and said second protruding latch of one of said first supporting rod and said second supporting rod are vertically displaced respectively, and said first protruding latches of said first supporting rod and said second supporting rod, and said second protruding latches of said first supporting rod and said second supporting rod are horizontally linearly displaced respectively, such that when said first supporting rod passes through a first pinhole on said first circuit board and said second supporting rod passes through a second pinhole on said first circuit board, said first protruding latches of said first and second supporting rods prop against said bottom of said first circuit board, and when said first supporting rod passes through a first pinhole on said second circuit board and said second supporting rod passes through a second pinhole on said second circuit board, said second protruding latches of said first and second supporting rods prop against said bottom of said second circuit board to prevent a movement of said connector respectively.

7. The connector according to claim 6, wherein each of said supporting rods is integrally formed with said mounting surface of said insulating housing.

8. The connector according to claim 6, wherein each of said first protruding latches is integrally formed with each of said pillared portions of said supporting rods.

9. The connector according to claim 6, wherein each of said second protruding latches is integrally formed with each of said pillared portions of said supporting rods.

10. The connector according to claim 6, wherein a projection of a protruding direction of said first protruding latch of said first supporting rod and said projection of said protruding direction of said first protruding latch of said second supporting rod have a angle of 180 degrees, and said projection of said protruding direction of said second protruding latch of said first supporting rod and said projection of said protruding direction of said second protruding latch of said second supporting rod have said angle of 180 degrees.

* * * * *